United States Patent [19]

Miller et al.

[11] Patent Number: 4,775,882

[45] Date of Patent: Oct. 4, 1988

[54] LATERAL BIPOLAR TRANSISTOR

[75] Inventors: David L. Miller, Thousand Oaks; Peter M. Asbeck, Newbury Park, both of Calif.

[73] Assignee: Rockwell International Corporation, El Segundo, Calif.

[21] Appl. No.: 932,239

[22] Filed: Nov. 19, 1986

[51] Int. Cl.⁴ .................. H01L 29/72; H01L 29/161; H01L 27/12

[52] U.S. Cl. ........................................ 357/35; 357/4; 357/16; 357/34; 357/55; 357/56; 357/60

[58] Field of Search ................. 357/60, 35, 34, 4, 55, 357/56, 16, 4 SL

[56] References Cited

U.S. PATENT DOCUMENTS 4,137,543 1/1979 Beneking ............................... 357/16
4,677,456 6/1987 Feist ...................................... 357/34

FOREIGN PATENT DOCUMENTS 60-10775 1/1985 Japan ..................................... 357/16

OTHER PUBLICATIONS

IBM Technical Disclosure Bulletin, "Metal–InAS Contact for Vertical Heterojunction Transistors", vol. 29, No. 5, Oct. 1986.

Primary Examiner—J. Carroll
Assistant Examiner—Ngan Van Ngo
Attorney, Agent, or Firm—H. Fredrick Hamann; Craig O. Malin

[57] ABSTRACT

Silicon doping of GaAs provides n conductivity in {100} planes and p conductivity in {111} A planes. A split level of Si-doped GaAs utilizes this phenomena to provide a bipolar transistor. In one embodiment, the emitter is one level of the layer in the {100} planes, and the collector is another level of the layer in the {100} planes. These n conductivity levels are joined by {111} A planes to form a p conductivity base. The junctions in the layer between the {100} planes and the {111} A planes form an npn transistor.

10 Claims, 1 Drawing Sheet

LATERAL BIPOLAR TRANSISTOR

BACKGROUND OF THE INVENTION

This invention relates to the field of solid state electronics and particularly to lateral bipolar transistors fabricated from III-V compounds.

Lateral bipolar transistors are potentially key elements in many integrated circuits, particularly digital circuits. Compared with vertical bipolar transistors or with conventional heterojunction bipolar transistors (HBTs), they offer a number of advantages such as:

(1) Their fabrication is potentially simpler because all key layers are at or near the surface, rather than being buried as in a conventional HBT;

(2) They operate naturally in the low current regime of interest for large scale integrated circuits (LSI) (by contrast, it is hard to efficiently operate vertical HBTs at low current because the emitter area must be kept large due to photolithographic limitations);

(3) Their base resistance can be low because of the proximity of the base to the surface; and (4) They can be easily integrated with other circuit elements such as Schottky diodes, metal semiconductor field effect transistors (MESFETs), saturated resistors, etc.

In comparison with MESFETs or high electron mobility transistors (HEMTs), the lateral bipolar transistors offer advantages such as:

(1) higher transconductance;
(2) higher current handling capability; and
(3) potentially more uniform turn-on voltage.

Until the present invention, a major problem with lateral bipolar transistors is their difficulty of fabrication. For adequate current gain and cutoff frequency, the base width should be small, generally in the submicron regime, a size which is hard to obtain using conventional methods.

SUMMARY OF THE INVENTION

It is an object of the invention to provide a lateral bipolar transistor with a submicron base.

It is an object of the invention to provide a lateral bipolar transistor with a uniform turn-on voltage.

It is an object of the invention to provide a lateral bipolar transistor with a high cut-off frequency.

It is an object of the invention to provide a lateral bipolar transistor which is easier to fabricate than prior art lateral bipolar transistors.

According to the invention, an npn structure is formed in a single, epitaxial layer on a GaAs substrate. This layer is GaAs doped with silicon. It has a split level to utilize both the n conductivity in the {100} planes and the p conductivity in the {111} A planes which occur naturally in silicon-doped GaAs grown by molecular beam epitaxy and perhaps other techniques.

An emitter contact is located on one level of the junction layer in the n conductivity {100} planes. A collector contact is located on the other level of the junction layer in the n conductivity {100} planes. These n conductivity levels are joined by the sloping {111} A planes which are p conductivity. A base contact is located on the p conductivity portion of the layer to form the base of an npn transistor.

The transistor is supported on a (100) plane of a semi-insulating GaAs substrate which has been etched to obtain a (111) A face of appropriate submicron dimensions (near 0.3 to 0.5 um). A buffer layer of undoped AlGaAs or a super lattice is deposited on the substrate. The active silicon-doped GaAs layer is formed on the buffer layer and it conforms to the shape of the etched substrate. Thus, the active layer has p conductivity regions which lie on the (100) plane and an n conductivity region which lies on the (111) A plane.

Metal contacts are provided on the two levels of the active layer on the (100) plane to provide emitter and collector contacts.

Contact to the base is made through a spacer or confinement layer which extends over the bipolar junctions in the active layer. The spacer layer is doped with silicon or with silicon and beryllium to make it lightly n conductivity. This reduces parasitic contact overlap capacitances. A p-type contact layer of beryllium doped GaAs and a metal contact are provided to complete the base contact.

These and other objects and features of the invention will be apparent from the following detailed description taken with reference to the accompanying drawing.

DESCRIPTION OF THE PREFERRED EMBODIMENT

Figure 1:
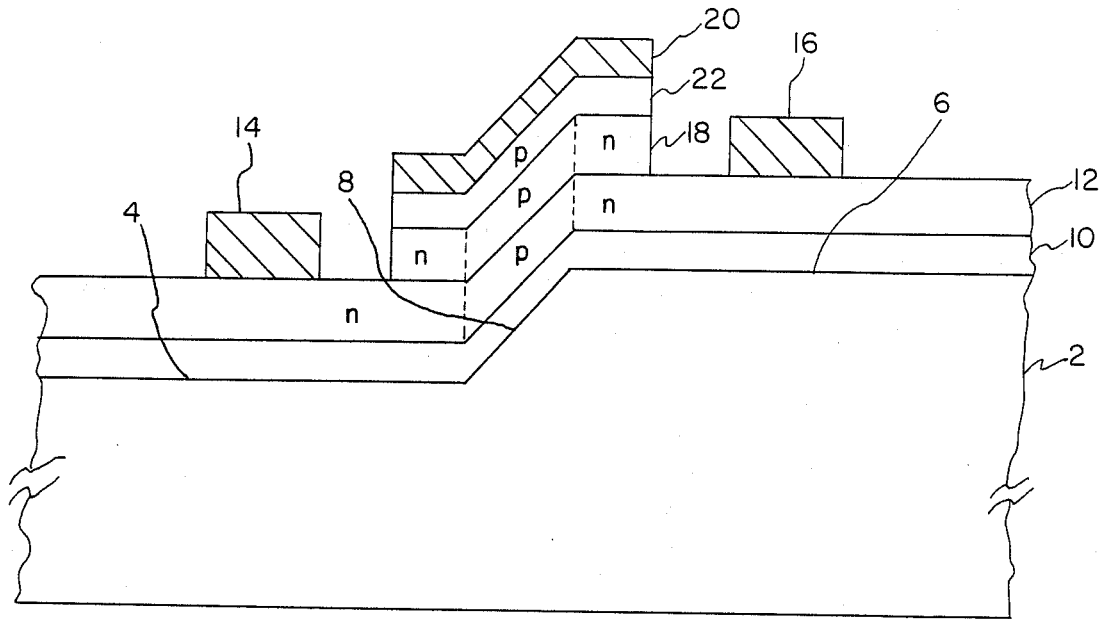
FIG. 1 is a cross sectional view of a lateral bipolar transistor illustrating the structure of the invention.

The structure of a lateral bipolar transistor is illustrated in the cross section shown in FIG. 1. A semi-insulating GaAs substrate 2 has two surfaces 4, 6 in {100} planes. A ramp 8 in the (111) A plane joins the two surfaces. An undoped AlGaAs epitaxial layer 10 covers the surface of substrate 2 and provides a buffer layer for active layer 12. Other types of buffer layers such as a superlattice buffer layer could be used.

Active layer 12 is an epitaxial layer of silicon-doped GaAs. Because the silicon doping of GaAs is crystal-plane dependent, the portions in {100} planes will be n conductivity and the ramp portion in {111} A planes will be p conductivity. Metal contacts 14, 16 form the emitter contact and the collector contact, or they can be reversed as desired.

The ramp portion forms the base of an npn transistor. Its length depends upon the different in elevation between the adjoining (100) surfaces. This difference is obtained by etching substrate 2 (as described later) and can be in the range of about 0.1 to 0.5 um etch depth. A confinement or spacer layer 18 separates the base portion from its overlying contact 20. This layer 18 extends over the bipolar junctions and reduces parasitic contact overlap capacitance. It is an epitaxial layer of AlGaAs doped with Si or other suitable dopant such as a combination of silicon and beryllium to make layer 18 lightly n conductivity in the (100) regions. A contact layer 22 of beryllium doped GaAs covers the confinement layer, and the metal base contact 20 is deposited on it.

The lateral bipolar transistor can be fabricated on a wafer surface using photolithography, wet chemical etching, and molecular beam epitaxy. A suitable photoresist pattern is formed on the (100) surface of undoped, semi-insulating GaAs. The photoresist pattern is oriented so that the np junctions will be in the <110> direction. The pattern is then etched with a crystallographic, plane-selective etchant such as $H_3PO_4:H_2O_2$ (1:10). This etchant attacks the Ga-terminated {111} A planes less rapidly than it etches {100} planes or As-terminated {111} B planes. Therefore, aligning a photoresist pattern along the <110> direction of a {100} wafer results in a "ramped" structure consisting of (100) planes separated by a (111) A ramp. Based upon geometrical relations, etching an exposed GaAs (100) plane to a depth of about 0.4 um will provide a (111) A ramp about 0.5 um wide.

After the plane-selective substrate etching is complete, the photoresist is removed, and epitaxial layers are grown over the patterned substrate using standard molecular beam epitaxy (MBE) procedures.

In the embodiment shown in FIG. 1, a buffer layer 10 of undoped AlGaAs or a superlattice buffer is first deposited on the substrate.

MBE growth of active layer 12 is done under As-stabilized conditions. Silicon doping will result in n type conductivity on the (100) planes 4 and 6, whereas p-type doping will result on the (111) A plane 8.

After growing the spacer and base contact layers 18, 22, contacts to the base can be made directly to the wafer surface. In the emitter and collector contact areas, the spacer and base contact layers can be etched back selectively to expose active layer 12. Then, emitter and collector contacts 14, 16 and other circuit elements such as Schottky barriers can be deposited on the active layer.

According to the invention, bilateral transistors with tightly controlled base widths can be produced. Such transistors may have cut-off frequencies ($f_t$) as high as 10-20 GHz. Although this is lower than the $f_t$ obtainable in vertical heterojunction bipolar transistors (HBTs), it is ideal for low power large scale integrated circuits because the $f_t$ should be obtainable at low current levels.

Figure 2:
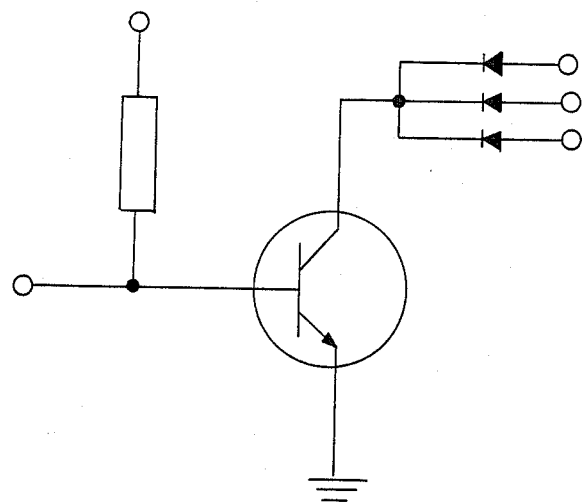
FIG. 2 is a Schottky-transistor-logic circuit utilizing a lateral bipolar resistor of the invention.

The lateral bipolar transistor should be useful in many logic approaches, but is particularly compatible with the Schottky-transistor-logic approach shown in FIG. 2. The injector could be implemented with a saturated resistor made in the (100) plane of the active layer. Similarly, the Schottky barriers can be deposited directly on this n conductivity plane.

Compared with present heterojunction integrated injection logic (I²L) transistors, the lateral bipolar transistor of this invention should be faster because the parasitic device capacitances are less, and it should be more flexible in circuit design because its terminals (the emitter and collector terminals) are not tied together, but are available for independent routing. The transistor can also be integrated directly with MESFETs which would be ideal for circuitry requiring the threshold voltage control or the transconductance of bipolar transistors combined with the high input impedance of MESFETs. For example in A/D converters, MESFETs could be used in sample and hold circuits, and bipolar transistors could be used in the comparators.

Numerous variations can be made without departing from the invention. For example, pnp bipolar transistors can be made by etching the active layer so that the base portion is in {100} planes and the emitter and collector portions are in {111} A planes. This can be accomplished by an additional masking and etching step, or by utilizing a groove etched into the active layer. Semiconductor compounds and dopants other than GaAs and Si can be used provided that they exhibit the necessary crystal-plane dependent doping effect. Accordingly, it should be understood that the form of the invention described above is illustrative and is not intended to limit the scope of the invention.

What is claimed is:

1. A lateral bipolar transistor comprising:
   a III-V semiconductor substrate;
   an epitaxial active layer supported by the substrate, the active layer comprising a semiconductor having a dopant that provides a first conductivity in {100} planes and an opposite conductivity in {111} A planes, the active layer having lower and upper portions in {ϕ} planes which are joined by a base portion in {111} A planes thereby forming a bipolar junction in the active layer;
   a contact on the lower portion;
   a contact on the upper portion; and
   a base contact on the base portion, whereby the base portion has a first conductivity and the lower and upper portions have an opposite conductivity thus forming a bipolar transistor.

2. The bipolar transistor as claimed in claim 1 including an epitaxial buffer layer between the substrate and active layer.

3. The bipolar transistor as claimed in claim 1 wherein the base contact comprises:
   an epitaxial spacer layer on the base portion of the active layer and extending over the bipolar junction;
   an epitaxial contact layer on the spacer layer; and
   a metal contact on the contact layer.

4. The bipolar transistor as claimed in claim 1 wherein the substrate comprises semi-insulating GaAs, the active layer comprises GaAs doped with Si, whereby the first conductivity is n conductivity and the bipolar junction is an npn junction.

5. The bipolar transistor as claimed in claim 4 wherein the base contact comprises:
   an epitaxial AlGaAs spacer layer on the base portion of the active layer and extending over the npn junction;
   an epitaxial p-conductivity GaAs contact layer on the spacer layer; and
   a metal contact on the contact layer.

6. The bipolar transistor as claimed in claim 4 including an epitaxial AlGaAs buffer layer between the substrate and the active layer.

7. A bipolar transistor comprising:
   a semi-insulating GaAs substrate;
   an epitaxial GaAs active layer above the substrate doped with Si to provide n conductivity in {100} planes, the active layer having lower and upper portions in {100} planes which are joined by a base portion in {111} A planes;
   a contact on the lower portion;
   a contact on the upper portion; and
   a base contact on the base portion, whereby the base portion is p conductivity GaAs joined to the lower and upper portions of n conductivity GaAs to form an npn junction bipolar transistor.

8. The bipolar transistor as claimed in claim 7 including an epitaxial AlGaAs buffer layer between the substrate and the active layer.

9. The bipolar transistor as claimed in claim 7 wherein the base contact comprises:
   an epitaxial GaAs spacer layer on the base portion of the active layer and extending over the npn junction;
   an epitaxial p-conductivity GaAs contact layer on the spacer layer; and a metal contact on the contact layer.

10. A lateral bipolar transistor comprising:
a III-V semiconductor substrate;
an epitaxial active layer above the substrate, the active layer comprising a semiconductor having a dopant that provides a first conductivity in planes having a first orientation and an opposite conductivity in planes having a second orientation, the active layer having lower and upper portions which are parallel to the first orientation planes and which are joined by a base portion which is parallel to the second orientation planes;
a contact on the lower portion;
a contact on the upper portion; and
a base contact on the base portion, whereby the base portion has a conductivity which is opposite the conductivity of the lower and upper portions thus forming a bipolar transistor.

* * * * *